(12) United States Patent
Vaartstra

(10) Patent No.: US 7,294,556 B2
(45) Date of Patent: Nov. 13, 2007

(54) METHOD OF FORMING TRENCH ISOLATION IN THE FABRICATION OF INTEGRATED CIRCUITRY

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 338 days.

(21) Appl. No.: 11/031,696

(22) Filed: Jan. 7, 2005

(65) Prior Publication Data

US 2005/0124171 A1 Jun. 9, 2005

Related U.S. Application Data

(62) Division of application No. 10/615,051, filed on Jul. 7, 2003, now Pat. No. 7,125,815.

(51) Int. Cl.
*H01L 21/76* (2006.01)
(52) U.S. Cl. ............... 438/424; 438/783; 257/E21.545
(58) Field of Classification Search ........ 438/424–426, 438/433, 435, 758, 778, 783; 257/E21.545, 257/E21.546
See application file for complete search history.

(56) References Cited

U.S. PATENT DOCUMENTS

| | | | |
|---|---|---|---|
| 3,809,574 A | 5/1974 | Duffy et al. | |
| 3,990,927 A | 11/1976 | Montier | |
| 4,474,975 A | 10/1984 | Clemons et al. | |
| 5,105,253 A | 4/1992 | Pollock | |
| 5,156,881 A | 10/1992 | Okano et al. | |
| 5,182,221 A | 1/1993 | Sato | |
| 5,387,539 A | 2/1995 | Yang et al. | |
| 5,410,176 A | 4/1995 | Liou et al. | |
| 5,470,798 A | 11/1995 | Ouellet | |
| 5,604,149 A | 2/1997 | Paoli et al. | |
| 5,616,513 A | 4/1997 | Shepard | |

(Continued)

FOREIGN PATENT DOCUMENTS

EP 0817251 A 1/1998

(Continued)

OTHER PUBLICATIONS

Beekmann et al., *Sub-micron Gap Fill and In-Situ Planarisation Using Flowfill™ Technology*, Electrotech 1-7 ULSI Conference, Portland, OR (Oct. 1995).
Curtis, et al., *APCVD TEOS: $O_3$ Advanced Trench Isolation Applications*, Semiconductor Fabtech, 9th Ed., pp. 241-247 (pre-Jul. 2003).

(Continued)

*Primary Examiner*—Brook Kebede
(74) *Attorney, Agent, or Firm*—Wells St. John P.S.

(57) ABSTRACT

This invention includes methods of forming a phosphorus doped silicon dioxide comprising layers, and methods of forming trench isolation in the fabrication of integrated circuitry. In one implementation, a method of forming a phosphorus doped silicon dioxide comprising layer includes positioning a substrate within a deposition chamber. First and second vapor phase reactants are introduced in alternate and temporally separated pulses to the substrate within the chamber in a plurality of deposition cycles under conditions effective to deposit a phosphorus doped silicon dioxide comprising layer on the substrate. One of the first and second vapor phase reactants is $PO(OR)_3$ where R is hydrocarbyl, and an other of the first and second vapor phase reactants is $Si(OR)_3OH$ where R is hydrocarbyl.

21 Claims, 3 Drawing Sheets

U.S. PATENT DOCUMENTS

| | | |
|---|---|---|
| 5,702,977 A | 12/1997 | Jang et al. |
| 5,719,085 A | 2/1998 | Moon et al. |
| 5,741,740 A | 4/1998 | Jang et al. |
| 5,770,469 A | 6/1998 | Uram et al. |
| 5,776,557 A | 7/1998 | Okano et al. |
| 5,786,039 A | 7/1998 | Brouquet |
| 5,786,263 A | 7/1998 | Perera |
| 5,801,083 A | 9/1998 | Yu et al. |
| 5,863,827 A | 1/1999 | Joyner |
| 5,883,006 A | 3/1999 | Iba |
| 5,888,880 A | 3/1999 | Gardner et al. |
| 5,895,253 A | 4/1999 | Akram |
| 5,895,255 A | 4/1999 | Tsuchiaki |
| 5,904,540 A | 5/1999 | Sheng et al. |
| 5,923,073 A | 7/1999 | Aoki et al. |
| 5,930,645 A | 7/1999 | Lyons et al. |
| 5,930,646 A | 7/1999 | Gerung et al. |
| 5,943,585 A | 8/1999 | May et al. |
| 5,950,094 A | 9/1999 | Lin et al. |
| 5,960,299 A | 9/1999 | Yew et al. |
| 5,972,773 A | 10/1999 | Liu et al. |
| 5,976,949 A | 11/1999 | Chen |
| 5,981,354 A | 11/1999 | Spikes et al. |
| 5,989,978 A | 11/1999 | Peidous |
| 5,998,280 A | 12/1999 | Bergemont et al. |
| 6,013,583 A | 1/2000 | Ajmera et al. |
| 6,030,881 A | 2/2000 | Papasouliotis et al. |
| 6,033,961 A | 3/2000 | Xu et al. |
| 6,051,477 A | 4/2000 | Nam |
| 6,090,675 A | 7/2000 | Lee et al. |
| 6,156,674 A | 12/2000 | Li et al. |
| 6,171,962 B1 | 1/2001 | Karlsson et al. |
| 6,187,651 B1 | 2/2001 | Oh |
| 6,190,979 B1 | 2/2001 | Radens et al. |
| 6,191,002 B1 | 2/2001 | Koyanagi |
| 6,300,219 B1 | 10/2001 | Doan et al. |
| 6,326,282 B1 | 12/2001 | Park et al. |
| 6,329,266 B1 | 12/2001 | Hwang et al. |
| 6,355,966 B1 | 3/2002 | Trivedi |
| 6,448,150 B1 | 9/2002 | Tsai et al. |
| 6,455,394 B1 | 9/2002 | Iyer et al. |
| 6,534,395 B2 | 3/2003 | Werkhoven et al. |
| 6,583,028 B2 | 6/2003 | Doan et al. |
| 6,583,060 B2 | 6/2003 | Trivedi |
| 6,617,251 B1 | 9/2003 | Kamath et al. |
| 6,930,058 B2 * | 8/2005 | Hill et al. .................. 438/783 |
| 6,933,225 B2 | 8/2005 | Werkhoven et al. |
| 7,053,010 B2 | 5/2006 | Li et al. |
| 2001/0006255 A1 | 7/2001 | Kwon et al. |
| 2001/0006839 A1 | 7/2001 | Yeo |
| 2001/0041250 A1 | 11/2001 | Haukke et al. |
| 2001/0046753 A1 | 11/2001 | Gonzales et al. |
| 2002/0000195 A1 | 1/2002 | Kao et al. |
| 2002/0004284 A1 | 1/2002 | Chen |
| 2002/0018849 A1 | 2/2002 | George et al. |
| 2003/0032281 A1 | 2/2003 | Werkhoven et al. |
| 2003/0129826 A1 | 7/2003 | Werkhoven et al. |
| 2004/0032006 A1 | 2/2004 | Yun et al. |
| 2004/0082181 A1 | 4/2004 | Doan et al. |
| 2004/0209484 A1 | 10/2004 | Hill et al. |
| 2004/0266153 A1 | 12/2004 | Yongjun |
| 2005/0009368 A1 | 1/2005 | Vaarstra |
| 2005/0079730 A1 | 4/2005 | Beintner et al. |
| 2005/0112282 A1 | 5/2005 | Gordon et al. |
| 2005/0124171 A1 | 6/2005 | Vaarstra |
| 2005/0142799 A1 | 6/2005 | Seo |

FOREIGN PATENT DOCUMENTS

| | | |
|---|---|---|
| EP | 959493 A2 * | 11/1999 |
| JP | 02277253 A | 11/1990 |
| JP | 05-315441 | 11/1993 |
| JP | 06-334031 | 12/1994 |
| JP | 146224 | 1/1996 |
| WO | 02/27063 A2 | 4/2002 |
| WO | PCT/US04/21156 | 8/2006 |

OTHER PUBLICATIONS

Disclosed Anonymounsy 32246, *Substrate Contact With Closed Bottom Trenches*, Research Disclosure, 1 page (Feb. 1991).

Gasser et al., *Quasi-monolayer deposition of silicon dioxide*, 250 Thin Solid Films, pp. 213-218 (1994).

George et al., *Atomic layer controlled deposition of $SiO_2$ and $Al_2O_3$ using ABAB . . . binary reaction sequence Chemistry*, 82/83 Applied Surface Science, pp. 460-467 (1994).

Hasumann et al., *Catalytic vapor deposition of highly conformal silica nanolaminates*, Department of Chemistry and Chemical Biology, Harvard University, pp. 1-13 (May 14, 2002).

Hausmann et al., *Rapid Vapor Deposition of Highly Conformal Silica Nanolaminates*, 298 Science, pp. 402-406 (Oct. 11, 2002).

Horie et al., *Kinetics and Mechanism of the Reactions of $O(^3P)$ with $SiH_4$, $CH_3SiH_3$, $(CH_3)_2SiH_2$, and $(CH_3)_3SiH$*, 95 J. Phys. Chem., pp. 4393-4400 (1991).

Joshi et al., *Plasma Deposited Organosilicon Hydride Network Polymers as Versatile Resists for Entirely Dry Mid-Deep UV Photolithography*, 1925 SPIE, pp. 709-720 (1993).

Kiermasz et al., *Planarisation for Sub-Micron Devices Utilising a New Chemistry*, 1-2 Electrotech, Dumic Conference, California (Feb. 1995).

Klaus et al., *Atomic Layer Deposition of $SiO_2$ Using Catalyzed and Uncatalyzed Self-Limiting Surface Reactions*, 6 Surface Review and Letters, Nos. 3 & 4, pp. 435-448 (1999).

Kojima et al., *Planarization Process Using a Multi-Coating of Spin-on-Glass*, V-MIC Conference, California, 2 pages (1995).

Matsuura et al., *A Highly Reliable Self-planarazing Low-k Intermetal Dielectric for Sub-quarter Micron Interconnects*, IEEE, pp. 785-788 (1997).

Matsuura et al., *Novel Self-planarizing CVD Oxide for Interlayer Dielectric Applications*, IEEE, pp. 117-120 (1994).

McClatchie et al., *Low Dielectric Constant Flowfill™ Technology for IMD Applications*, 7 pages (pre-Aug. 1999).

Miller et al., *Self-limiting chemical vapor deposition of an ultra-thin silicon oxide film using tri-(tert-butoxy)silanol*, 397 Thin Solid Films, pp. 78-82 (2001).

Morishita et al., *Atomic-layer chemical-vapor-deposition of silicon-nitride*, 112 Applied Surface Science, pp. 189-204 (1997).

Shareef et al., *Subatmospheric chemical vapor deposition ozone/TEOS process for $SiO_2$ trench filling*, J. Vac. Sci. Technol. B 13(4), pp. 1888-1995 (Jul./Aug. 1995).

Withnall et al., *Matrix Reactions of Methylsilanes and Oxygen Atoms*, 92 J. Phys. Chem., pp. 594-602 (1988).

Yokoyama et al., *Atomic layer controlled deposition of silicon nitride and in situ growth observation by infrared reflection absorption spectroscopy*, 112 Applied Surface Science, pp. 75-81 (1997).

U.S. Appl. No. 10/655,699, filed Sep. 2002, Derderian et al.
U.S. Appl. No. 10/615,051, filed Jul. 2003, Vaartstra.
U.S. Appl. No. 10/806,923, filed Mar. 2004, Li et al.
U.S. Appl. No. 10/931,524, filed Aug. 2004, Sandhu.
PCT/US2004/021156; Filed Jun. 30, 2004; Search Report.
PCT/US2004/021156; Filed Jun. 30, 2004; Written Opinion Issued on Jan. 18, 2005; 6 pps.

Chen et al., *Excimer Laser-Induced Ti Silicidation to Eliminate the Fine-Line Effect for Integrated Circuity Device Fabrication*, 149 Journal of Electrochemical Society, No. 11, pp. G609-G612 (2002).

Nishiyama et al., *Agglomeration Resistant Self-Aligned Silicide Process Using $N_2$ Implantation Into $TiSi_2$*, 36 Jpn. J.Appl. Phys., Part 1, No. 6A, pp. 3639-3643 (Jun. 1997).

Wolf, *Chapter 13: Polycides and Salicides of $TiSi_x$, $CoSi2$, and NiSi*, Silicon Processing for the VLSI Era, vol. IV, pp. 603-604 (pre-2003).

* cited by examiner

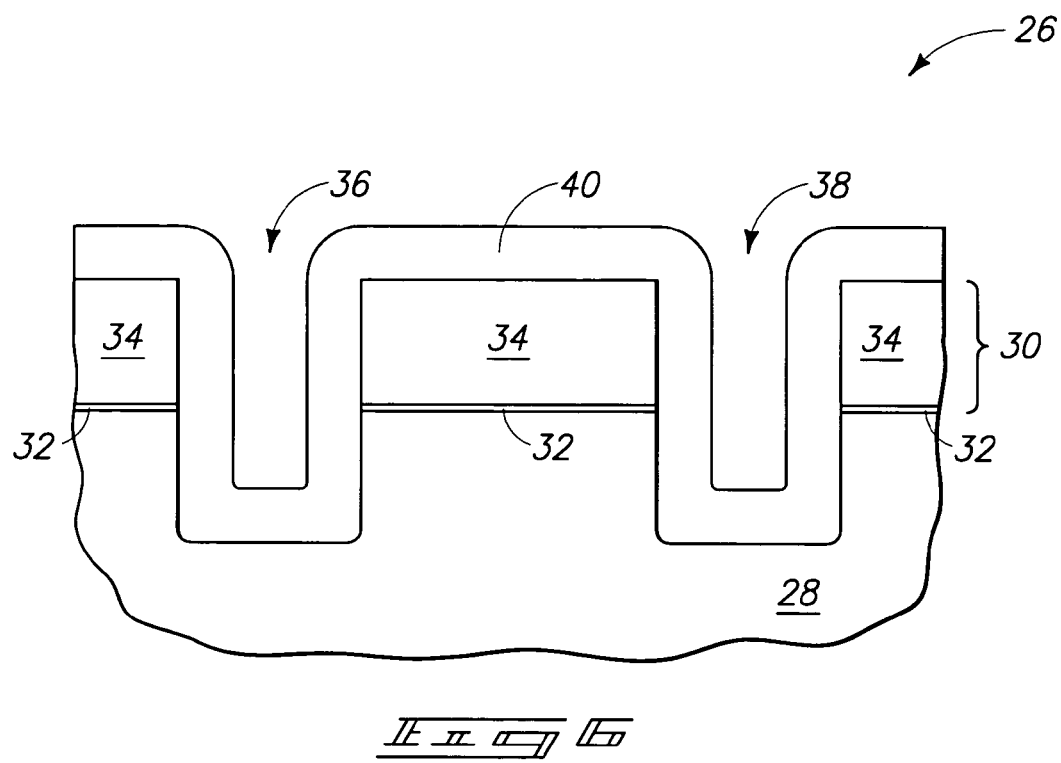
_Fig 6_
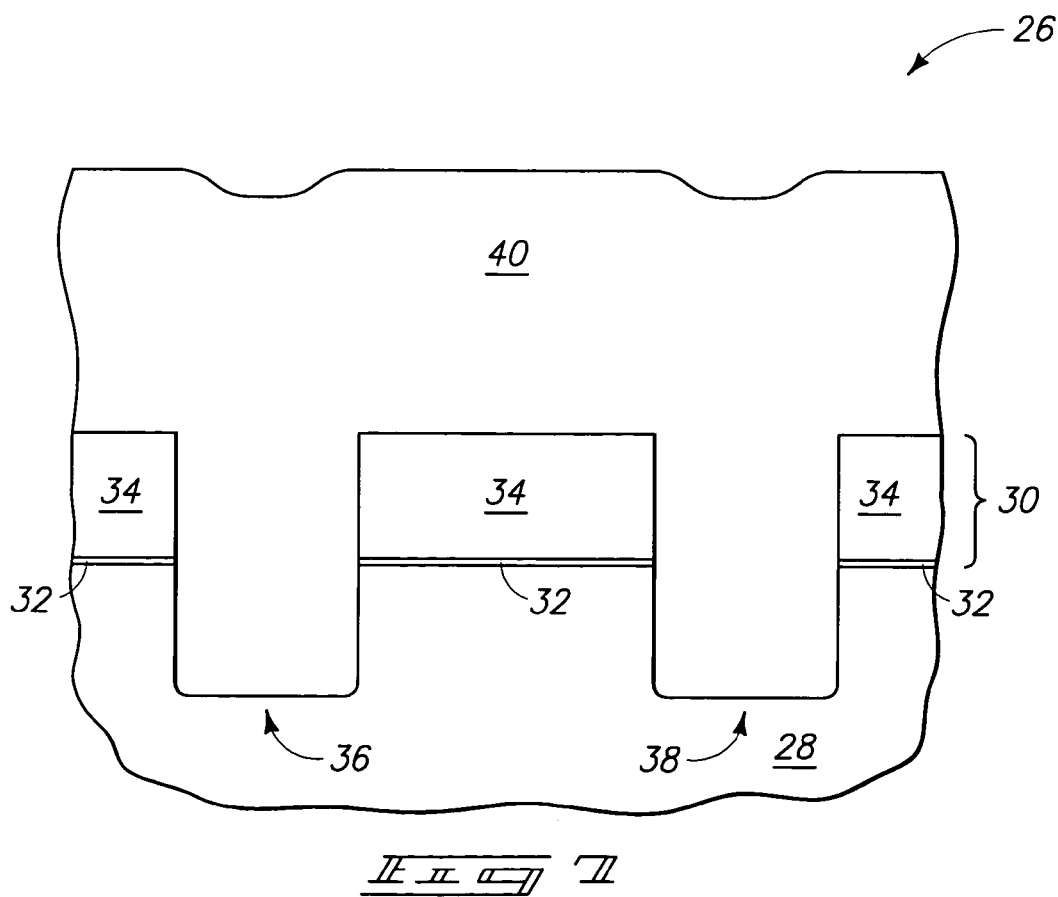
_Fig 7_

METHOD OF FORMING TRENCH ISOLATION IN THE FABRICATION OF INTEGRATED CIRCUITRY

RELATED PATENT DATA

This patent resulted from a divisional application of U.S. patent application Ser. No. 10/615,051, filed Jul. 7, 2003, now U.S. Pat. No. 7,125,815 entitled "Methods of Forming a Phosphorus Doped Silicon Dioxide Comprising Layers", naming Brian A. Vaartstra as inventor, the disclosure of which is incorporated by reference.

TECHNICAL FIELD

This invention relates to methods of forming phosphorus doped silicon dioxide comprising layers, and to methods of forming trench isolation in the fabrication of integrated circuitry.

BACKGROUND OF THE INVENTION

One commonly used material in the fabrication of integrated circuitry is silicon dioxide. Such might be utilized as essentially 100% pure, or in combination with other materials, including property-modifying dopants. Accordingly, silicon dioxide might be utilized as a mixture with other materials in forming a layer or layers and may or may not constitute a majority of the given layer. Exemplary materials are borophosphosilicate glass (BPSG), phosphosilicate glass (PSG), and borosilicate glass (BSG). Typically, such materials have anywhere from 1% to 4% atomic concentration of each of boron and/or phosphorus atoms, although atomic percent concentrations in excess of 5% have also been used.

As semiconductor devices continue to shrink geometrically, such has had a tendency to result in greater shrinkage in the horizontal dimension than in the vertical dimension. In some instances, the vertical dimension increases. Regardless, increased aspect ratios (height to width) of the devices result, making it increasingly important to develop processes that enable dielectric and other materials to fill high aspect or increasing aspect ratio trenches, vias and other steps or structures. A typical dielectric material of choice has been doped and/or undoped silicon dioxide comprising materials, for example those described above. Dopants such as boron and phosphorus can facilitate a reflowing of the deposited layer at a higher temperature to facilitate more completely filling openings on a substrate. Various reactant precursors can be utilized in forming silicon dioxide layers, for example the silanols disclosed in U.S. Pat. No. 6,300,219.

SUMMARY OF THE INVENTION

This invention includes methods of forming phosphorus doped silicon dioxide comprising layers, and methods of forming trench isolation in the fabrication of integrated circuitry. In one implementation, a method of forming a phosphorus doped silicon dioxide comprising layer includes positioning a substrate within a deposition chamber. First and second vapor phase reactants are introduced in alternate and temporally separated pulses to the substrate within the chamber in a plurality of deposition cycles under conditions effective to deposit a phosphorus doped silicon dioxide comprising layer on the substrate. One of the first and second vapor phase reactants is $PO(OR)_3$ where R is hydrocarbyl, and an other of the first and second vapor phase reactants is $Si(OR)_3OH$ where R is hydrocarbyl.

In one implementation, a method of forming a phosphorus doped silicon dioxide comprising layer includes positioning a substrate within a deposition chamber. A first species is chemisorbed to a surface of the substrate to form a first species monolayer onto the surface within the chamber from a first vapor phase reactant comprising $PO(OR)_3$, where R is hydrocarbyl. The chemisorbed first species is contacted with a second vapor phase reactant comprising $Si(OR)_3OH$, where R is hydrocarbyl, to form a monolayer comprising Si and O. Chemisorbing with the first species and contacting the chemisorbed first species with the second reactant are successively repeated under conditions effective to deposit a phosphorus doped silicon dioxide comprising layer on the substrate.

Other aspects and implementations are contemplated.

BRIEF DESCRIPTION OF THE DRAWINGS

Preferred embodiments of the invention are described below with reference to the following accompanying drawings.

FIG. 6 is a view of the FIG. 5 wafer fragment at a processing step subsequent to that shown by FIG. 5.

FIG. 7 is a view of the FIG. 6 wafer fragment at a processing step subsequent to that shown by FIG. 6.

DETAILED DESCRIPTION OF THE PREFERRED EMBODIMENTS

Figure 1:
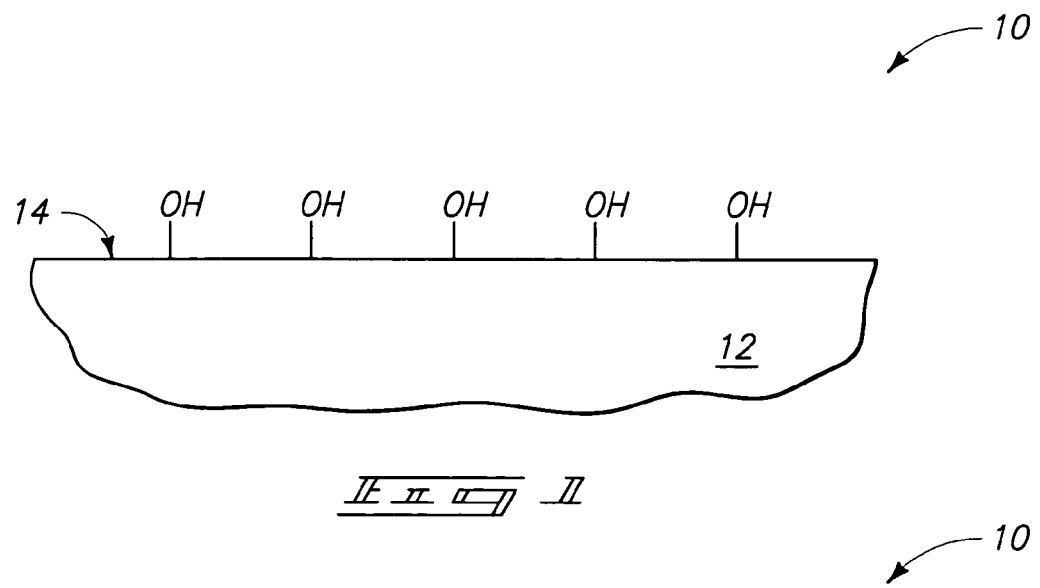
FIG. 1 is a diagrammatic sectional view of a semiconductor wafer fragment in process in accordance with an aspect of the invention.

This disclosure of the invention is submitted in furtherance of the constitutional purposes of the U.S. Patent Laws "to promote the progress of science and useful arts" (Article 1, Section 8).

In one implementation, a method of forming a phosphorus doped silicon dioxide comprising layer includes positioning a substrate to be deposited upon within a deposition chamber. First and second vapor phase reactants are introduced in alternate and temporally separated pulses to the substrate within the chamber in a plurality of deposition cycles under conditions effective to deposit a phosphorus doped silicon dioxide comprising layer on the substrate. One of the first and second vapor phase reactants is $PO(OR)_3$, where R is hydrocarbyl. An other of the first and second vapor phase reactants is $Si(OR)_3OH$, where R is hydrocarbyl. Such might be conducted by atomic layer deposition (ALD) methods (for example including chemisorbing and contacting methods), by chemical vapor deposition (CVD) methods, and by other methods, as well as by combinations of these and other methods. CVD and ALD are used herein as referred to in the co-pending U.S. patent application Ser. No. 10/133,947, filed on Apr. 25, 2002, entitled "Atomic Layer Deposition Methods and Chemical Vapor Deposition Methods", and listing Brian A. Vaartstra as the inventor, which is now U.S. Publication No. 2003-0200917. This U.S. Publication No. 2003-0200917, filed on Apr. 25, 2002 is hereby fully incorporated by reference as if presented in its entirety herein. Preferred and understood reduction-to-practice examples provided herein are understood to be primarily by atomic layer deposition.

The R hydrocarbyl of the $PO(OR)_3$ and the R hydrocarbyl of the $Si(OR)_3OH$ may be the same or different, and regardless in one preferred embodiment the R hydrocarbyl of each contains only from one to five carbon atoms. One preferred and reduction-to-practice $PO(OR)_3$ material comprises triethyl phosphate. One preferred exemplary and reduction-to-practice $Si(OR)_3OH$ material comprises tristertbutylsilanol. Exemplary preferred conditions comprise a temperature of from about 50° C. to about 500° C., and more preferably at from about 100° C. to about 300° C. Exemplary pressure conditions are subatmospheric, preferably being from about $10^{-7}$ Torr to about 10 Torr, and more preferably from about $10^{-4}$ Torr to about 1 Torr. The conditions might comprise plasma generation of at least one of the first and second reactants, or be void of plasma generation of the first and second reactants. If plasma generation is utilized, such might occur within the chamber of deposition, and/or externally thereof. Most preferred are believed to be conditions which are void of plasma generation of the first and second reactants.

The conditions might be effective to form the silicon dioxide comprising layer to have very low phosphorus content, for example to have no more than 0.5 atomic percent phosphorus, including lesser amounts. Alternately, the conditions might be effective to form the silicon dioxide comprising layer to have at least 1.0 atomic percent phosphorus including, for example, 5.0 and greater atomic percent phosphorus.

The method might be void of introducing any vapor phase reactant to the chamber other than the first and second vapor phase reactants in the forming of the phosphorus doped silicon dioxide comprising layer. Alternately, the method might include introducing another vapor phase reactant, different from the first and second vapor phase reactants, intermediate at least some of the separated pulses of the first and second vapor phase reactants. By way of example only, an exemplary another vapor phase reactant is oxygen containing, for example $O_2$, $O_3$ and/or any vapor phase oxygen containing compound. Ozone pulses, for example as a mixture of $O_2$ and $O_3$, in addition to the $PO(OR)_3$ flows have been determined to facilitate greater phosphorus incorporation, for example above 5 atomic percent, if such is desired.

Another exemplary vapor phase reactant would be boron containing, and whereby the phosphorus doped silicon dioxide comprising layer would also then comprise boron, for example in fabricating a BPSG or BPSG-like material. An exemplary boron containing material reactant is $B(OR)_3$.

The alternate and temporally separated pulses might include one or a combination of chamber pump down and/or purging of the chamber with an inert gas (i.e., $N_2$ and/or any noble gas) intermediate the separated pulses to remove unreacted precursor/reactant.

One prior art technique of forming a silicon dioxide comprising layer is described in Hausmann et al., *Rapid Vapor Deposition of Highly Conformal Silica Nanolaminates*, SCIENCE MAGAZINE, Vol. 298, pp. 402–406 (2002). Such a process initially utilizes a methylaluminum reactant precursor, for example triethyl aluminum or aluminum dimethylamide, which forms an initial aluminum containing layer on the substrate. An alkoxysilanol, for example tris (tert-butoxy)silanol, is thereafter flowed to the substrate. Apparently, the aluminum presence provides a self-limited catalytic reaction whereby a silicon dioxide comprising layer deposits to some self-limiting thickness anywhere from 100 Angstroms to 700 Angstroms. In other words, continued exposure to the alkoxysilanol does not result in continuing growth of the silicon dioxide comprising layer. Apparently, the silicon dioxide layer self-limited growth occurs in some catalytic manner, as opposed to a simple ALD-like manner due to significantly more than a few monolayers being formed by the silanol exposure/pulsing. Regardless, aluminum is incorporated in the resultant layer, which may not be desired.

While the invention disclosed herein does not preclude its use with the Hausmann et al.-like process, most preferably the inventive process is void of introducing any vapor phase aluminum containing reactant to the chamber in the forming of the phosphorus doped silicon dioxide comprising layer. Further preferably in accordance with the invention, the substrate is void of aluminum in the forming of the phosphorus doped silicon dioxide comprising layer.

In one implementation, a method of forming a phosphorus doped silicon dioxide comprising layer includes at least some ALD processing. By way of example only, an exemplary such process is described with reference to FIGS. 1–3. Referring to FIG. 1, a substrate 10 is positioned within any suitable deposition chamber (not shown). In one exemplary embodiment, substrate 10 is a semiconductor substrate, for example comprising some material 12 which preferably includes at least some semiconductive material, and may, of course, include multiple materials and layers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 has a surface 14 which is provided to be hydroxylated (having pending OH groups) as shown. Other surface termination is also contemplated to be effective in the process herein described. If hydroxylated, such surface might by hydroxylated prior to provision within the deposition chamber, or hydroxylated within the deposition chamber. An exemplary technique for hydroxylating surface 14 includes exposure of the surface to water vapor. Further, the surface might be naturally hydroxylated simply from exposure to ambient atmosphere.

Figure 2:
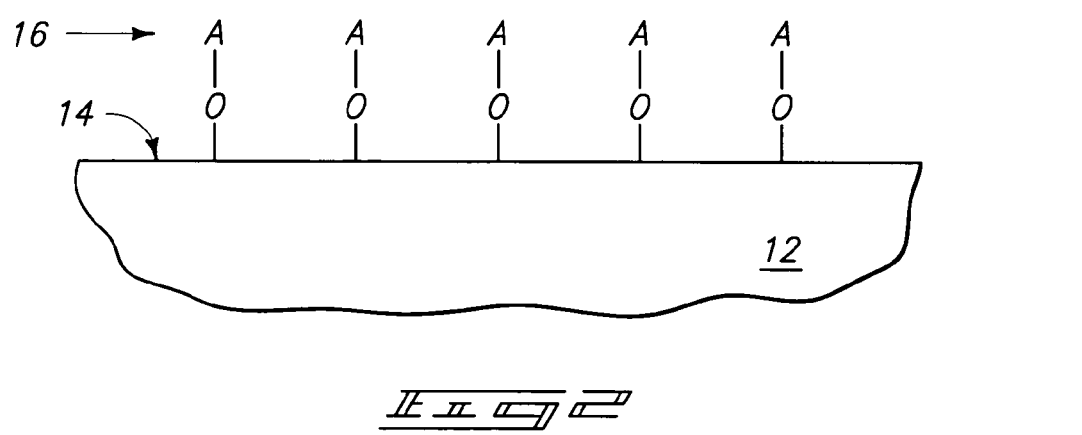
FIG. 2 is a view of the FIG. 1 wafer fragment at a processing step subsequent to that shown by FIG. 1.

Referring to FIG. 2, a first species is chemisorbed to form a first species monolayer 16 onto the hydroxylated surface within the chamber from a first vapor phase reactant comprising $PO(OR)_3$, where R is hydrocarbyl, for example as described above. Such is depicted as being comprised of a variable "A" as constituting at least a part of layer 16 in FIG. 2. Preferred conditions and other attributes are as described above with respect to the first described implementation.

Figure 3:
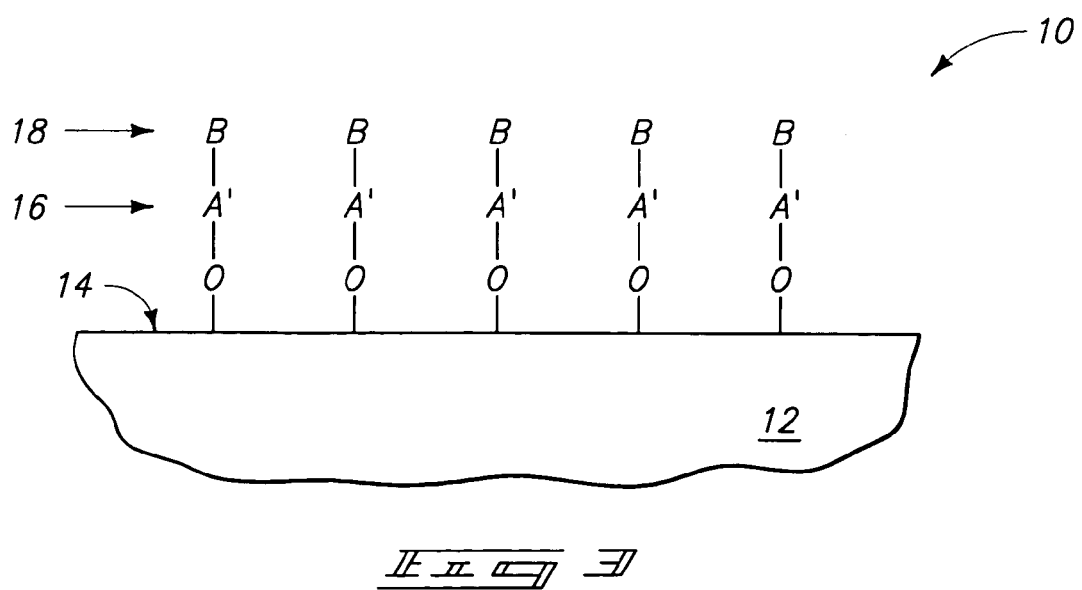
FIG. 3 is a view of the FIG. 2 wafer fragment at a processing step subsequent to that shown by FIG. 2.

Referring to FIG. 3, the chemisorbed first species has been contacted with a second vapor phase reactant comprising $Si(OR)_3OH$, where R is hydrocarbyl, to form a monolayer 18 which will comprise Si and O. Again, conditions are preferably as described above with respect to the first implementation. FIG. 3 depicts layer 18 as comprising a variable "B", with the chemisorbed first species monolayer being depicted as A' exemplary of some modification of the A species in the chemisorbing of B with A, with the exact preferred and typical species A and B not having been determined. Regardless, chemisorbing with the first species and contacting the chemisorbed first species with the second reactant is successively repeated under conditions effective to deposit a phosphorus doped silicon dioxide comprising layer on the substrate. Typically and preferably, such chemisorbings and contactings are conducted in alternate and temporally separated pulses to the substrate, for example as described above in the first described implementation.

The immediately above-described implementation was relative to the chemisorbing of a surface with $PO(OR)_3$ followed by a second vapor phase reactant exposure comprising $Si(OR)_3OH$, and by which an aspect of the invention was reduced-to-practice, although aspects of the invention are not necessarily so limited.

Figure 4:
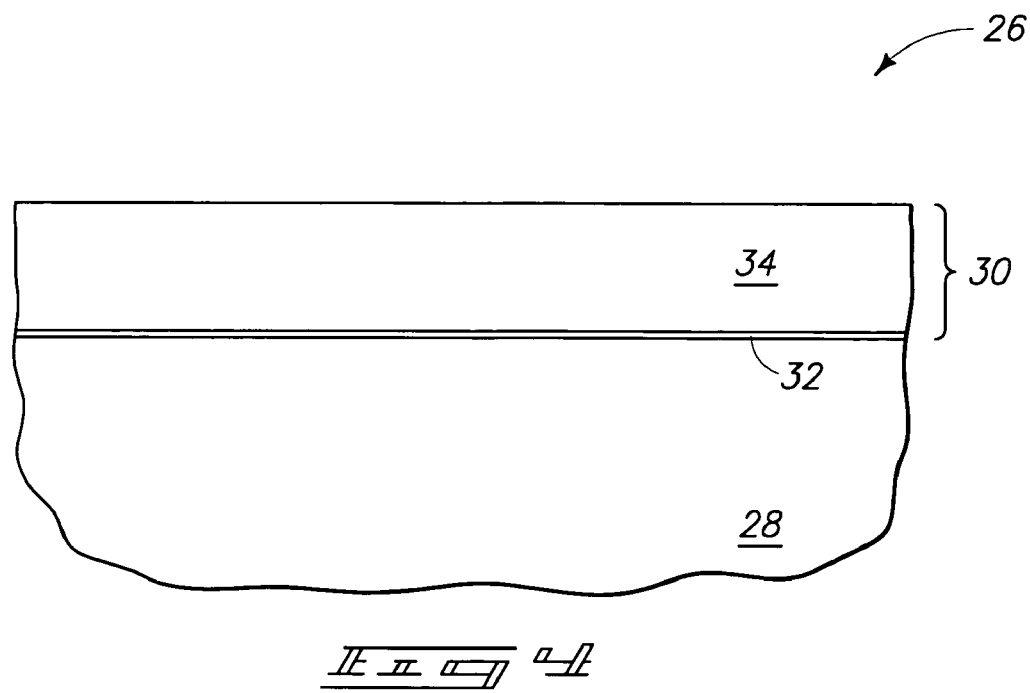
FIG. 4 is a diagrammatic sectional view of a semiconductor wafer fragment in process in accordance with an aspect of the invention.

Regardless, aspects of the invention might preferably be utilized in methods of forming trench isolation in the fabrication of integrated circuitry, for example as shown and described with reference to FIGS. 4–7. FIG. 4 shows a semiconductor substrate 26 comprising a bulk monocrystalline silicon or other semiconductive material substrate 28. A masking layer 30 is formed over semiconductor substrate 28. Such is depicted as comprising a pad oxide layer 32 and an overlying nitride comprising layer 34, for example silicon nitride.

Figure 5:
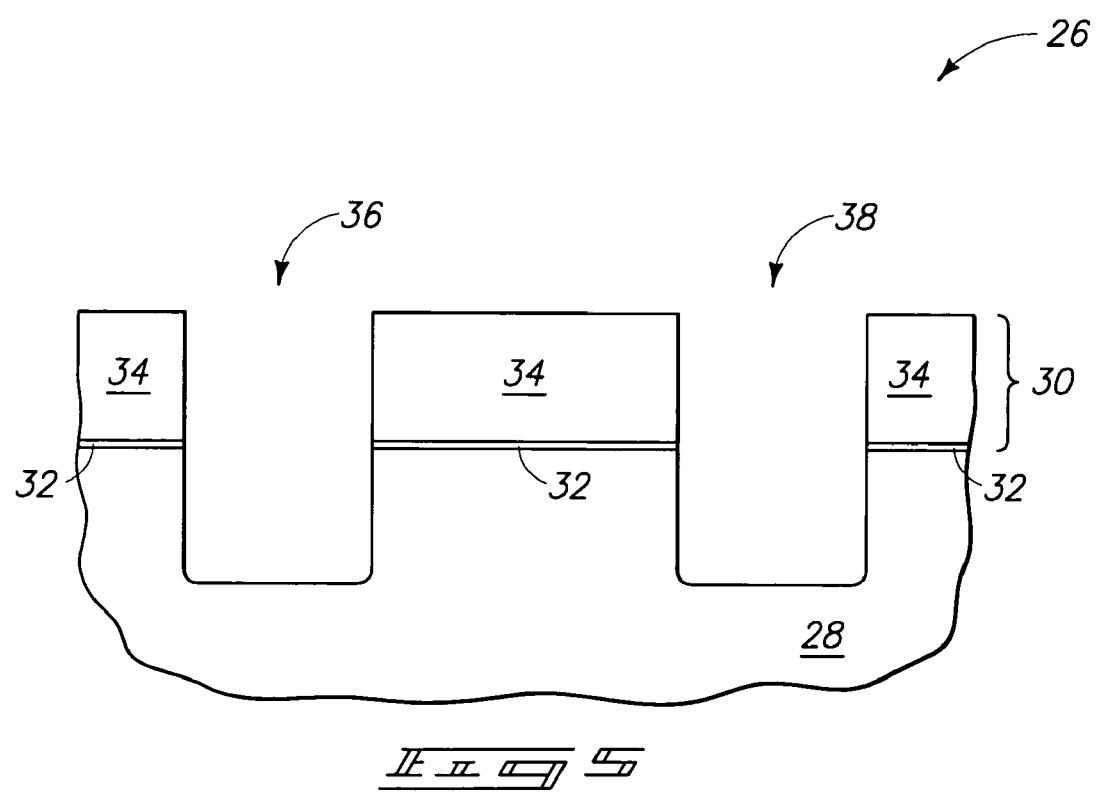
FIG. 5 is a view of the FIG. 4 wafer fragment at a processing step subsequent to that shown by FIG. 4.

Referring to FIG. 5, isolation trenches 36 and 38 have been etched through masking layer 30 into the semiconductive material of substrate 28/26. A thermal oxide layer or other layer, for example silicon nitride (not shown), might be provided now or subsequently, for example with respect to silicon dioxide by exposing substrate 26 to thermal oxidizing conditions.

Referring to FIG. 6, a phosphorus doped silicon dioxide comprising layer 40 has been formed within semiconductive material isolation trenches 36 and 38. Exemplary techniques for doing so include introducing first and second vapor phase reactants in alternate and temporally separated pulses to the substrate within the chamber in a plurality of deposition cycles, as described above, and also for example, by the chemisorbings and contacting methods as described above. As depicted, the depositing is effective to deposit phosphorus doped silicon dioxide comprising layer 40 onto masking layer 30, and also is depicted as not being effective to selectively deposit phosphorus doped silicon dioxide layer 40 within isolation trenches 36 and 38. In the context of this document, a "selective/selectively deposit" is one which deposits a material over one region of a substrate as compared to another at a deposition thickness ratio of at least 2:1.

The depositing might be effective to completely fill isolation trenches 36 and 38, or to not fill such isolation trenches for example as shown in FIG. 6. Deposition processing, for example as described in any of the above, could continue to completely fill such trenches, for example as shown in FIG. 7. Alternately by way of example only, the FIG. 6 construction could be filled with another material before or after removing the material from over masking layer 30.

An exemplary reduction-to-practice example utilized triethyl phosphate and tris(tert-butoxy)silanol as first and second respective vapor phase reactants. A 650 Angstrom conformal layer of PSG (8 atomic percent phosphorus) was deposited over a silicon nitride lined trench using respective two second reactive pulses of each reactant, with a one second argon purge followed by a three second pump down without flowing argon between the reactant pulses. This was conducted for 600 complete cycles at 300° C. No ozone was utilized. Respective bubbler/ampoule temperatures for feeding the triethyl phosphate and tris(tert-butoxy)silanol were 50° C. and 40° C.

Such processing was also conducted with the triethyl phosphate having a temperature of 60° C. and with tris(tert-butoxy)silanol at 70° C. One (1) second and 0.5 second respective pulses of such triethyl phosphate and of the tris(tert-butoxy)silanol yielded a 650 Angstrom film after 300 complete cycles, providing an approximate 2.2 Angstrom per cycle rate of deposition. This was somewhat higher than the first reduction-to-practice example deposition, which was at 1.1 Angstroms per cycle. The deposited film was substantially carbon-free, and the phosphorus content was below 0.5 atomic percent. Longer triethyl phosphate exposure at such reactant temperature is expected to yield higher growth rates and increase phosphorus content in the deposited film.

In another reduction-to-practice example, triethyl phosphate from a 60° C. bubbler/ampoule was fed to a substrate within a deposition chamber for one second. This was followed by the flow of 30 sccm Ar for one second, followed by three seconds of pumping down the chamber without flowing any gas thereto. Thereafter, 25 sccm of a combined stream of $O_2/O_3$ (5% to 12% $O_3$ by volume) was flowed to the chamber for two seconds. This was followed by a 30 sccm flow of Ar for one second, followed by three seconds of pump down while feeding no gas to the chamber. Then, tris(tert-butoxy)silanol was flowed to the chamber from a 60° C. bubbler/ampoule for two seconds. This was followed by one second of Ar flow at 30 sccm, again followed by three seconds of pump down while no gas flowed to the chamber. This was conducted for 400 complete cycles, with pressure during all of the processing varying from 0.24 Torr to $10^{-6}$ Torr. Such resulted in a 1000 Angstrom thick layer having 5.7 atomic percent phosphorus incorporated therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming trench isolation in the fabrication of integrated circuitry, comprising:
    forming a masking layer over a semiconductor substrate;
    etching isolation trenches through the masking layer into semiconductive material of the semiconductor substrate; and
    after etching the isolation trenches, introducing first and second vapor phase reactants in alternate and temporally separated pulses to the substrate within the chamber in a plurality of deposition cycles effective to deposit a phosphorus doped silicon dioxide-comprising layer within the isolation trenches, one of the first and second vapor phase reactants being $PO(OR)_3$ where R is hydrocarbyl, and an other of the first and second vapor phase reactants being $Si(OR)_3OH$ where R is hydrocarbyl.

2. The method of claim 1 wherein the deposit is effective to fill the isoiation trenches.

3. The method of claim 1 wherein the deposit does not fill the isolation trenches.

4. The method of claim 1 wherein the deposition cycles are effective to deposit the phosphorus doped silicon dioxide-comprising layer on the masking layer.

5. The method of claim 1 wherein the deposition cycles are not effective to selectively deposit the phosphorus doped silicon dioxide-comprising layer within the isolation trenches.

6. The method of claim 1 wherein the deposition cycles are effective to form the silicon dioxide-comprising layer to have no more than 0.5 atomic percent phosphorus.

7. The method of claim 1 wherein the deposition cycles are effective to form the silicon dioxide-comprising layer to have at least 1.0 atomic percent phosphorus.

8. The method of claim 1 being void of introducing any vapor phase reactant to the chamber other than said first and second vapor phase reactants in said forming of the phosphorus doped silicon dioxide-comprising layer.

9. The method of claim 1 comprising introducing another vapor phase reactant different from the first and second vapor phase reactants intermediate at least some of said separated pulses of the first and second vapor phase reactants.

10. The method of claim 9 wherein the another vapor phase reactant is oxygen-containing.

11. The method of claim 10 wherein the another vapor phase reactant comprises $O_3$.

12. The method of claim 9 wherein the another vapor phase reactant is boron-containing, the phosphorus doped silicon dioxide-comprising layer comprising boron.

13. The method of claim 1 wherein the $PO(OR)_3$ comprises triethyl phosphate.

14. The method of claim 1 wherein the $Si(OR)_3OH$ comprises tris(tert-butoxy)silanol.

15. The method of claim 1 wherein the $PO(OR)_3$ comprises triethyl phosphate and wherein the $Si(OR)_3OH$ comprises tris(tert-butoxy)silanol.

16. The method of claim 1 comprising purging the chamber with an inert gas intermediate the separated pulses.

17. The method of claim 1 being void of aluminum on the substrate in said forming of the phosphorus doped silicon dioxide-comprising layer.

18. The method of claim 1 being void of introducing any vapor phase aluminum-containing reactant to the chamber in said forming of the phosphorus doped silicon dioxide-comprising layer.

19. The method of claim 1 wherein the deposition cycles comprise atomic layer deposition.

20. The method of claim 1 wherein the deposition cycles comprise plasma generation of at least one of the first and second reactants.

21. The method of claim 1 wherein the deposition cycles are void of plasma generation of the first and second reactants.

* * * * *

UNITED STATES PATENT AND TRADEMARK OFFICE
CERTIFICATE OF CORRECTION

PATENT NO. : 7,294,556 B2  Page 1 of 1
APPLICATION NO. : 11/031696
DATED : November 13, 2007
INVENTOR(S) : Vaartstra It is certified that error appears in the above-identified patent and that said Letters Patent is hereby corrected as shown below:

In column 6, line 62, in Claim 2, delete "isoiation" and insert -- isolation --, therefor.

Signed and Sealed this

Twenty-fifth Day of March, 2008

JON W. DUDAS
*Director of the United States Patent and Trademark Office*